United States Patent
Won et al.

(10) Patent No.: US 7,718,992 B2
(45) Date of Patent: May 18, 2010

(54) NITRIDE SEMICONDUCTOR DEVICE

(75) Inventors: Jong Hak Won, Kyungki-do (KR); Soo Han Kim, Kyungki-do (KR); Jae Woong Han, Kyungki-do (KR); Seong Suk Lee, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 668 days.

(21) Appl. No.: 11/525,012

(22) Filed: Sep. 22, 2006

(65) Prior Publication Data

US 2007/0069234 A1 Mar. 29, 2007

(30) Foreign Application Priority Data

Sep. 23, 2005 (KR) .................. 10-2005-0088772

(51) Int. Cl.
*H01L 29/06* (2006.01)
(52) U.S. Cl. .................. 257/14; 257/9; 257/E29.072; 257/E31.033; 257/E33.008
(58) Field of Classification Search .................. 257/14, 257/E33.008, E31.033, E29.072, 9, E29.069
See application file for complete search history.

(56) References Cited

U.S. PATENT DOCUMENTS

| 5,886,370 | A | * | 3/1999 | Sun et al. ..................... 257/94 |
| 5,903,586 | A | * | 5/1999 | Ramdani et al. ......... 372/45.01 |
| 6,614,060 | B1 | | 9/2003 | Wang et al. |
| 6,798,809 | B1 | * | 9/2004 | Gambin et al. ........... 372/45.01 |
| 6,838,705 | B1 | | 1/2005 | Tanizawa |
| 6,849,881 | B1 | * | 2/2005 | Harle et al. .................. 257/191 |
| 2002/0075920 | A1 | * | 6/2002 | Spruytte et al. ............... 372/45 |
| 2003/0006418 | A1 | | 1/2003 | Emerson et al. |
| 2004/0021142 | A1 | * | 2/2004 | Kuo ............................ 257/79 |
| 2004/0183063 | A1 | * | 9/2004 | Nakamura et al. ............ 257/14 |
| 2004/0262632 | A1 | * | 12/2004 | Marsh et al. ................. 257/194 |
| 2005/0017253 | A1 | * | 1/2005 | Hata ............................ 257/80 |
| 2005/0127394 | A1 | * | 6/2005 | Nagahama et al. .......... 257/103 |
| 2005/0156153 | A1 | * | 7/2005 | Futagawa .................... 257/14 |
| 2005/0202614 | A1 | * | 9/2005 | Spruytte et al. ............. 438/167 |
| 2006/0126688 | A1 | * | 6/2006 | Kneissl .................... 372/43.01 |
| 2007/0045655 | A1 | * | 3/2007 | Song et al. .................. 257/104 |
| 2008/0135829 | A1 | * | 6/2008 | Lee .............................. 257/13 |
| 2008/0135852 | A1 | * | 6/2008 | Udagawa .................... 257/76 |

FOREIGN PATENT DOCUMENTS

| JP | 08-167735 | 6/1996 |
| JP | 2004-140300 | 5/2004 |

* cited by examiner

*Primary Examiner*—Leonardo Andújar
*Assistant Examiner*—Teresa Arroyo
(74) *Attorney, Agent, or Firm*—McDermott Will & Emery LLLP

(57) ABSTRACT

A nitride semiconductor device is provided. In the device, first and second conductivity type nitride layers are formed. An active layer is formed between the first and second conductivity type nitride layers. The active layer includes at least one quantum barrier layer and at least one quantum well layer. Also, a current spreading layer is interposed between the first conductivity type nitride layer and the active layer. The current spreading layer has an In content greater than the quantum well layer of the active layer.

6 Claims, 4 Drawing Sheets

NITRIDE SEMICONDUCTOR DEVICE

CLAIM OF PRIORITY

This application claims the benefit of Korean Patent Application No. 2005-88772 filed on Sep. 23, 2005 in the Korean Intellectual Property Office, the disclosure of which is incorporated herein by reference.

BACKGROUND OF THE INVENTION

1. Field of the Invention

The present invention relates to a nitride-based nitride semiconductor device, more particularly which is improved in internal quantum efficiency, operating voltage and inverse voltage properties.

2. Description of the Related Art

In general, a nitride semiconductor layer is broadly applied to a green or blue light emitting diode (LED) used as a light source in full-color displays, image scanners, various signal systems and optical telecommunication devices, and a laser diode (LD).

Efficiency of the nitride semiconductor device is determined by internal quantum efficiency. i.e., recombination probability of electrons and holes in an active layer. In a major effort to boost the internal quantum efficiency, the active layer has been structurally improved and effective mass of carriers has been increased. Meanwhile, current crowding is mainly responsible for decline in efficiency of the nitride semiconductor device since carriers are not uniformly injected into the active layer.

Especially, current crowding is aggravated by inevitable arrangement of electrodes in the nitride semiconductor device. That is, when the nitride semiconductor device includes an insulating substrate such as a sapphire substrate, two electrodes are not disposed on opposed faces, but formed to face the same direction by mesa-etching an epitaxial layer. This is a planar nitride semiconductor light emitting device.

Such a planar nitride semiconductor device is disadvantaged in some aspects over a vertical light emitting device which has two electrodes formed on opposed faces of a light emitting structure. That is, in the planar nitride semiconductor device, current fails to travel uniformly across an overall light emitting area, thereby decreasing an effective light emitting area and also light emitting efficiency per light emitting area.

Therefore, in the art, to manufacture a high-efficiency nitride semiconductor device, there has arisen a need for a novel nitride semiconductor device which can spread current uniformly across the overall active layer to enhance light emitting efficiency.

SUMMARY OF THE INVENTION

The present invention has been made to solve the foregoing problems of the prior art and therefore an object according to certain embodiments of the present invention is to provide a novel nitride semiconductor device which adopts, between an active layer and a clad layer, a layer having a relatively high In content and also high carrier (especially electrons) mobility, thereby further allowing current to flow laterally and be spread more uniformly.

According to an aspect of the invention for realizing the object, there is provided a nitride semiconductor device including first and second conductivity type nitride layers; an active layer formed between the first and second conductivity type nitride layers, the active layer including at least one quantum barrier layer and at least one quantum well layer; and a current spreading layer interposed between the first conductivity type nitride layer and the active layer, the current spreading layer having an In content greater than the quantum well layer of the active layer.

The active layer includes a quantum barrier layer having a composition expressed by $In_{x1}Ga_{1-x1}N$, where $0 \leq x_1 < 1$ and a quantum well layer having a composition expressed by $In_{x2}Ga_{1-x2}N$, where $x_1 < x_2 < 1$, and the current spreading layer has a composition expressed by $In_y Ga_{1-y}N$, where $x_2 < y \leq 1$.

To sufficiently ensure current to flow laterally, high carrier mobility should be guaranteed. Preferably, the current spreading layer has an In content that is at least 5 mol % greater than the quantum well layer. Consequently the current spreading layer exhibits higher carrier mobility than the active layer.

In a preferable embodiment of the invention, the current spreading layer includes at least one pair of first and second layers stacked alternately and having a different composition from each other, and the first layer has a composition expressed by $In_y Ga_{1-y}N$ and the second layer is a GaN layer. More preferably, the current spreading layer is formed such that the first and second layers alternate with each other by two to twelve pairs. The at least two pairs assure a sufficient effect and the pairs in excess of twelve increase thickness of an overall layer and accordingly resistance, thereby degrading light emitting efficiency.

Preferably, the first layer has a thickness ranging from 10 Å to 100 Å and the second layer has a thickness ranging from 100 Å to 250 Å. But the invention is not limited thereto.

The current spreading layer with a high In content according to the invention is interposed between the n-type nitride layer and the active layer, i.e. an area which experiences severe current crowding, thereby further enhancing light emitting efficiency.

BRIEF DESCRIPTION OF THE DRAWINGS

The above and other objects, features and other advantages of the present invention will be more clearly understood from the following detailed description taken in conjunction with the accompanying drawings, in which:

FIG. 2a is a side sectional view illustrating a nitride semiconductor device according to a preferred embodiment of the invention;

FIG. 2b is an energy band diagram illustrating the nitride semiconductor device shown in FIG. 2a;

FIG. 3 is a schematic view for explaining effects of a current spreading layer according to the embodiment of FIG. 2a.

DETAILED DESCRIPTION OF THE PREFERRED EMBODIMENT

Preferred embodiments of the present invention will now be described in detail with reference to the accompanying drawings.

Figure 1:
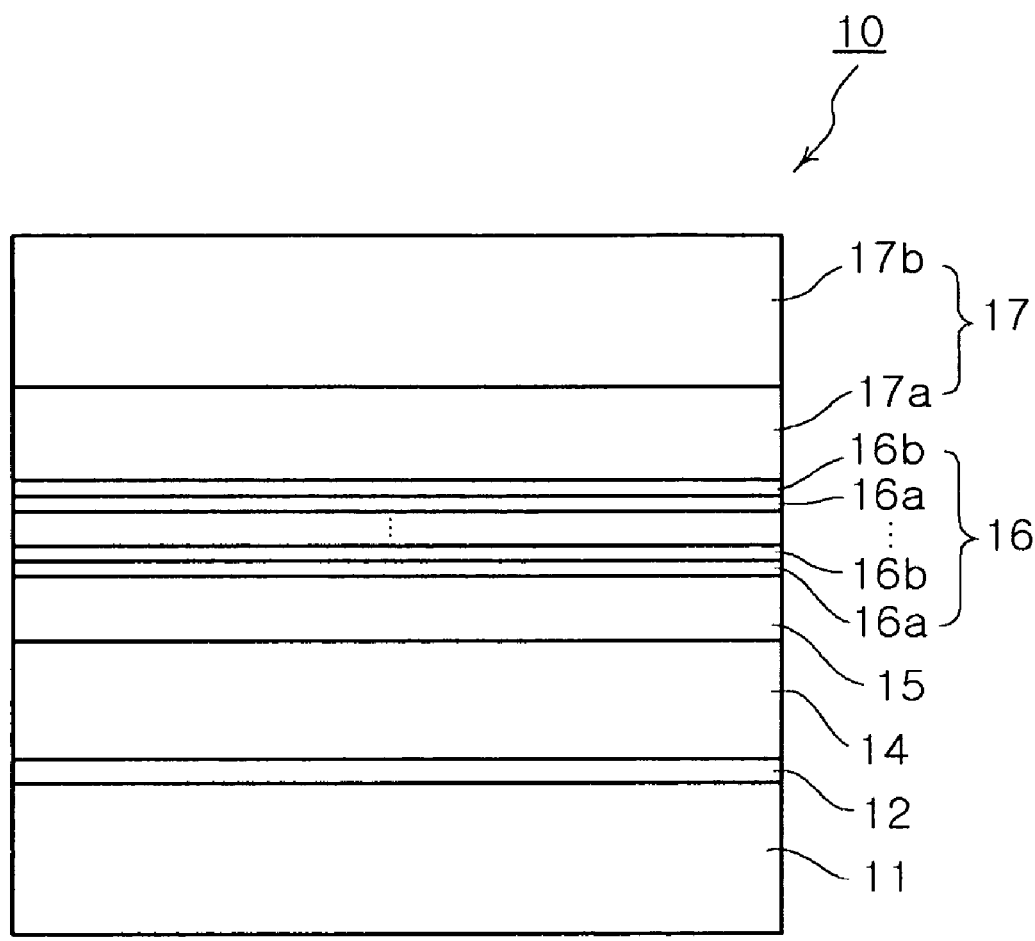
FIG. 1 is a side sectional view illustrating a nitride semiconductor device according to an embodiment of the invention.

FIG. 1 is a side sectional view illustrating a nitride semiconductor device 10 according to an embodiment of the invention.

Referring to FIG. 1, the nitride semiconductor device 10 includes a buffer layer 12, an n-type nitride semiconductor device 14, an active layer 16 and a p-type nitride semiconductor layer 17 stacked sequentially on a substrate 11.

The substrate 11 may be made of e.g., sapphire or SiC, which is a different material from the semiconductor device 10, or GaN, which is the same material as the semiconductor device 10. The active layer 16 may be of a multiple quantum well structure including a quantum well structure 16a and a quantum barrier layer 16b. Also, the p-type nitride semiconductor layer 17 may include a P-type AlGaN layer 17a for preventing electron overflowing and a P-type GaN layer 17b for providing a contact area.

The nitride semiconductor device 10 according to this embodiment includes an InGaN current spreading layer 15 formed between the n-type nitride semiconductor layer 14 and the active layer 16. The current spreading layer 15 has In content greater than the quantum well layer 16a. In general, purportedly a nitride layer with a great In content assures higher carrier mobility than a nitride layer of different compositions.

For example, electron mobility (about 3200 cm$^2$/V·s) in an InN layer is much higher than that (about 300 cm$^2$/V·s, 1000 to 1350 cm$^2$/V·s, respectively) in an AlN layer and a GaN layer.

Consequently, electrons are guaranteed to be highly mobile in the InGaN current spreading layer 15, thereby further ensuring current to flow laterally and thus be spread more uniformly. To sufficiently improve such lateral flow of current, preferably the current spreading layer 15 has an In content that is at least 5 mol % greater than the quantum well layer. This produces sufficient current spreading effect.

Preferably, in a case where the quantum barrier layer 16b is a nitride layer having a composition expressed by $In_{x1}Ga_{1-x1}N$, where $0 \leq x_1 < 1$ and the quantum well layer 16a has a composition expressed by $In_{x2}Ga_{1-x2}N$, where $x_1 < x_2 < 1$, the current spreading layer 15 has a composition expressed by $In_yGa_{1-y}N$, where $x_2 < y \leq 1$.

Figure 2:
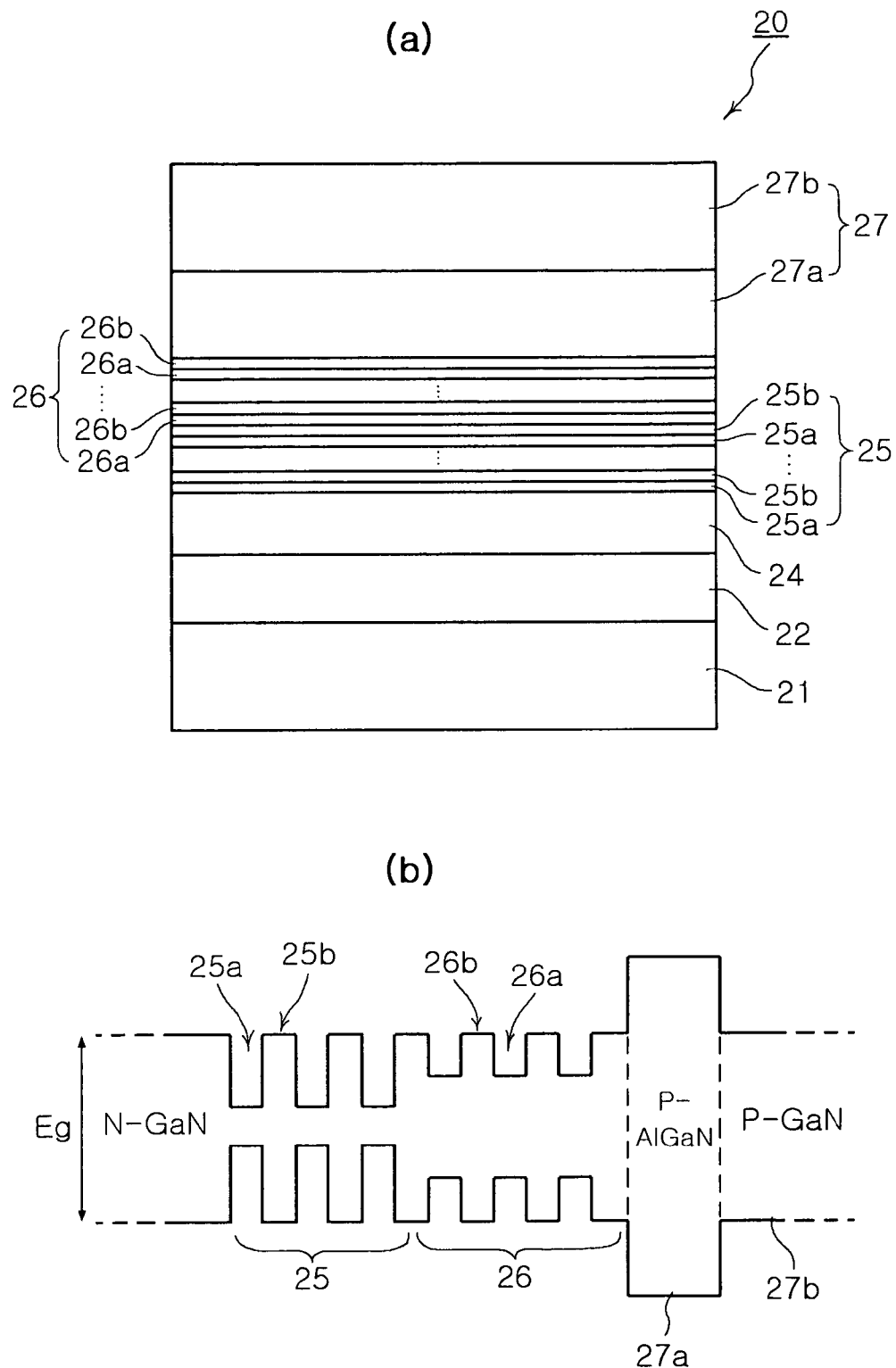

FIG. 2a is a side sectional view illustrating a nitride semiconductor device according to a preferred embodiment of the invention.

The nitride semiconductor device 20, in a similar manner to FIG. 1, includes a buffer layer 22, an n-type GaN layer 24, an active layer 26 of a multiple quantum well structure and a p-type AlGaN/GaN layer 27a and 27b stacked sequentially on a substrate 21.

The nitride semiconductor device 20 according to this embodiment includes a current spreading layer 25 interposed between the n-type nitride semiconductor layer 24 and the active layer 26.

The current spreading layer 25 according to this embodiment may include a first layer 25a made of InGaN and a second layer 25b made of GaN, which are preferably stacked alternately more than once.

Conventionally, the n-type nitride layer and active layer have often employed an InGaN/GaN superlattice structure to improve crystallinity. Here, the InGaN layer is required to have an In content lower than the quantum well layer in view of lattice match. On the other hand, the first layer 25a according to the invention necessarily has an In content greater than the quantum well layer 26a. As described above, a greater In content increases electron mobility, thereby ensuring current to be spread more uniformly. Preferably, the first layer 25a has an In content of at least 15 mol %.

The first layer 25a corresponds to the InGaN current spreading layer 15 shown in FIG. 1. The first layer 25a allows high electron mobility, further ensuring current to flow laterally and accordingly be spread uniformly. In a case where the quantum barrier layer 26b is a nitride layer having a composition expressed by $In_{x1}Ga_{1-x1}N$, where $0 \leq x_1 < 1$, and the quantum well layer 26a has a composition expressed by $In_{x2}Ga_{1-x2}N$, where $x_1 < x_2 < 1$, the first layer 25a of the current spreading layer 25 may have a composition expressed by $In_yGa_{1-y}N$, where $x_2 < y \leq 1$. FIG. 2b is an energy band diagram illustrating construction of such a current spreading layer 25.

Figure 3:
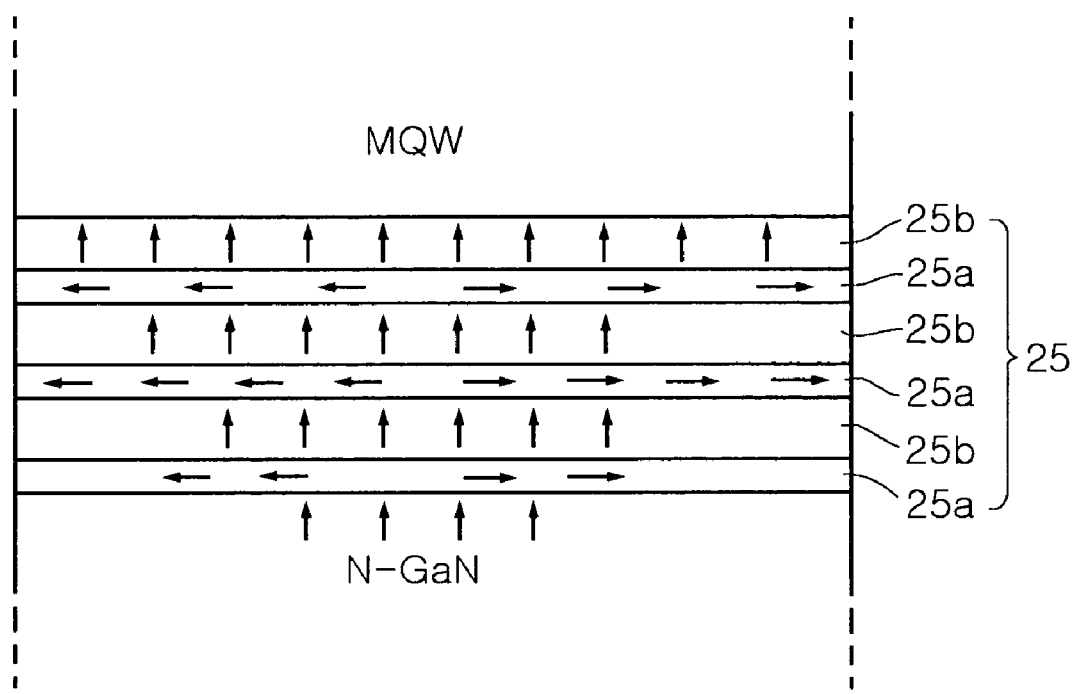

Moreover, this embodiment of the invention improves current spreading effect further than the embodiment in which the current spreading layer 25 is structured as a single layer (see FIG. 1). That is, in this embodiment, the InGaN first layer 25a is disposed alternately with the GaN second layer 25b more than once, thereby further enhancing current spreading effect. The effect is more readily understood by a schematic current flow in the current spreading layer 25 shown in FIG. 3.

Even if current injected into the current spreading layer 25 is crowded in a certain area (e.g. a central area) as indicated with arrows (see FIG. 3), current is spread laterally in the first layer 25a having higher electron mobility than the GaN second layer 25b. Moreover, the current spreading effect is gradually increased while the current enters other first layers 25a through other second layers 25b. In this fashion, according to the invention, the InGaN first layer 25a and the GaN second layer 25b are stacked alternately, thereby allowing current to be spread laterally and more uniformly. This significantly boosts light emitting efficiency.

Preferably, the first and second layers 25a and 25b of the current spreading layer 25 and 25b are stacked by two to twelve pairs. The at least two pairs ensure a sufficient effect and the pairs in excess of twelve increase thickness of an overall layer 25 and accordingly resistance. This degrades light emitting efficiency.

Preferably, the first layer 25a has a thickness ranging from 10 Å to 100 Å but is not limited thereto. The thickness less than 10 Å hardly yields current spreading effect and the thickness in excess of 100 Å may potentially deteriorate crystallinity due to lattice mismatch. Also, preferably, the second layer 25b has a thickness ranging from 100 Å to 250 Å. Here, the thickness less than 100 Å is unlikely to produce a desired effect owing to a tunneling effect. The thickness in excess of 250 Å increases thickness of the overall layer excessively, accordingly raising series resistance.

Operation and effects of the invention will be explained hereunder in more detail by way of a detailed example according to the invention.

Example

To improve light emitting efficiency of a nitride semiconductor device according to the invention, the nitride light emitting device (LED) was manufactured via Metal Organic Chemical Vapor Deposition (MOCVD) in a reactor of $NH_3$ atmosphere.

First, a GaN low-temperature nucleation growth layer was formed on a sapphire substrate. Then, an n-type GaN layer was grown to a thickness of 3 μm and at a doping concentration of $2 \times 10^{18}/cm^3$ via Si.

Subsequently, as suggested by the invention, a first layer made of $In_{0.28}Ga_{0.72}N$ and a second layer made of GaN were stacked alternately with each other four times, thereby forming a current spreading layer. Here, the first layer had a thickness ranging from 30 Å to 40 Å and the second layer had a thickness of 130 Å to 140 Å.

Next, an active layer of a single quantum well structure was formed on the current spreading layer. The active layer was comprised of an $In_{0.18}Ga_{0.82}N$ quantum well layer and a GaN layer to obtain a light of about 450 nm wavelength.

On the active layer were grown an AlGaN layer to a thickness of 30 nm and at a doping concentration of about $2\sim5\times10^{17}/cm^3$, and a p-type GaN layer to a thickness of about 120 nm.

Comparative Example

A nitride light emitting device was manufactured in a manner equal to the aforesaid Example. The Comparative Example adopted a superlattice structure which was conventionally employed to enhance crystallinity, in substitute for an electron blocking layer. That is, a first layer of $In_{0.18}Ga_{0.82}N$ having an In content equal to a quantum well layer and a second layer of GaN were stacked alternately with each other four times. Here, the first layer had a thickness of 30 Å to 40 Å and the second layer had a thickness of 130 Å to 140 Å in the same manner as in the Example.

Figure 4:
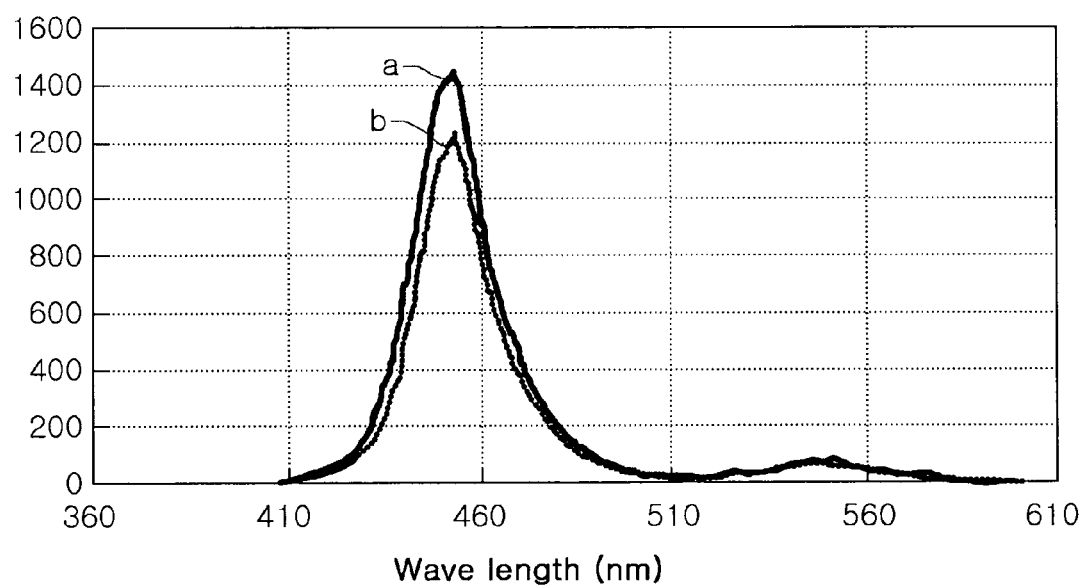
FIG. 4 is a graph illustrating EL spectrums to compare light emitting efficiency between a conventional light emitting device and a light emitting device according to an embodiment of the invention.

An electro-luminescence (EL) spectrum was measured for the two nitride light emitting devices obtained. FIG. 4 illustrates the results.

As shown in FIG. 4, the conventional light emitting device b employing a simple superlattice structure exhibited an EL spectrum of 1200 at a wavelength band of 450 nm. On the other hand, the light emitting device a manufactured according to the embodiment demonstrated an EL spectrum of 1400. These results have confirmed that the light emitting device employing the current spreading layer according to the invention is improved in light emitting efficiency by about 17% compared to the conventional light emitting device which merely shows better crystallinity. The current spreading layer according to the invention may be comprised of a single layer or a structure where the current spreading layer and a GaN layer are stacked alternately with each other. Furthermore, the current spreading layer of the invention has a greater In content than the quantum well layer, thereby enhancing electron mobility and hole mobility therein. Also, the current spreading layer, when interposed between the p-type nitride layer and the active layer, yields similar effects.

In addition, a light emitting device structure having an active layer of a multiple quantum well structure is depicted in the accompanying drawings of the invention. But the light emitting device may adopt an active layer of a single quantum well structure as in the Example. Further, the invention is beneficially applicable to other nitride semiconductor devices such as a light emitting diode (LED) and a laser diode (LD).

As set forth above, according to preferred embodiments of the invention, a layer having a relatively high In content is sandwiched between an active layer and a clad layer to guarantee high carrier (especially electron) mobility. This further ensures current to flow laterally and thus be spread more uniformly across an overall area, thereby producing a high efficiency nitride semiconductor device.

While the present invention has been shown and described in connection with the preferred embodiments, it will be apparent to those skilled in the art that modifications and variations can be made without departing from the spirit and scope of the invention as defined by the appended claims.

What is claimed is:

1. A nitride semiconductor device comprising:
    first and second conductivity type nitride layers;
    an active layer formed between the first and second conductivity type nitride layers, the active layer including at least one quantum barrier layer and at least one quantum well layer; and
    a current spreading layer interposed between the first conductivity type nitride layer and the active layer and having an In content that is at least 5 mol % greater than the quantum well layer,
    wherein the current spreading layer includes two to twelve pairs of first and second nitride layers stacked alternately and having a different composition from each other, and the first nitride layer has an In content that is at least 5 mol % greater than the quantum well layer.

2. The nitride semiconductor device according to claim 1, wherein the active layer includes a quantum barrier layer having a composition expressed by $In_{x1}Ga_{1-x1}N$, where $0 \leq x_1 < 1$ and a quantum well layer having a composition expressed by $In_{x2}Ga_{1-x2}N$, where $x_1 < x_2 < 1$.

3. The nitride semiconductor device according to claim 2, wherein the first layer has a composition expressed by $In_yGa_{1-y}N$, where $x_2 < y \leq 1$, and the second layer is a GaN layer.

4. The nitride semiconductor device according to claim 3, wherein the first layer has a thickness ranging from 10 Å to 100 Å.

5. The nitride semiconductor device according to claim 3, wherein the second layer has a thickness ranging from 100 Å to 250 Å.

6. The nitride semiconductor device according to claim 1, wherein the first conductivity type nitride layer comprises an n-type nitride layer and the second conductivity type nitride layer comprises a p-type nitride layer.

* * * * *